(12) United States Patent
Miyaki et al.

(10) Patent No.: US 6,441,400 B1
(45) Date of Patent: *Aug. 27, 2002

(54) SEMICONDUCTOR DEVICE AND METHOD OF FABRICATING THE SAME

(75) Inventors: Yoshinori Miyaki, Tachikawa; Kazunari Suzuki, Tokyo; Daisuke Omoda, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/051,077

(22) Filed: Jan. 22, 2002

Related U.S. Application Data

(63) Continuation of application No. 09/387,052, filed on Aug. 31, 1999, now Pat. No. 6,340,837.

(30) Foreign Application Priority Data

Aug. 31, 1998 (JP) .......................................... 10-245406

(51) Int. Cl.[7] .............................................. H01L 31/112
(52) U.S. Cl. .............................. 257/66; 257/66; 257/70; 257/72; 438/123
(58) Field of Search .................................. 257/666, 670, 257/672, 692, 783, 787; 438/123; 361/813

(56) References Cited

U.S. PATENT DOCUMENTS

| | | | |
|---|---|---|---|
| 5,177,032 A | 1/1993 | Fogal et al. ................. | 438/123 |
| 5,411,921 A | 5/1995 | Negoro ........................ | 438/118 |
| 5,424,576 A | 6/1995 | Djennas et al. ............. | 257/666 |
| 5,429,992 A | 7/1995 | Abbott et al. ................ | 438/123 |
| 5,637,913 A | 6/1997 | Kajhara et al. ............. | 257/666 |
| 6,153,924 A | 11/2000 | Kinsman ..................... | 257/666 |
| 6,430,837 * | 1/2002 | Miyaki et al. .............. | 257/666 |

FOREIGN PATENT DOCUMENTS

| | | |
|---|---|---|
| EP | 0712159 | 5/1996 |
| JP | 63-204753 | 8/1988 |
| JP | 7-263470 | 10/1995 |
| JP | 8-204107 | 8/1996 |
| JP | 9-111204 | 4/1997 |
| JP | 10-012760 | 1/1998 |

* cited by examiner

*Primary Examiner*—Jasmine J B Clark
(74) *Attorney, Agent, or Firm*—Antonelli, Terry, Stout & Kraus, LLP

(57) ABSTRACT

A semiconductor device includes a semiconductor chip having a plurality of electrodes formed on a first major surface thereof, a resin package sealing the semiconductor chip therein, a plurality of leads electrically connected to the electrodes of the semiconductor chip and formed so as to extend inside and outside the resin package, and a support lead supporting the semiconductor chip at a part of a second major surface of the semiconductor chip opposite the first major surface. The semiconductor chip is bonded to the support lead with an adhesive tape.

2 Claims, 16 Drawing Sheets

SEMICONDUCTOR DEVICE AND METHOD OF FABRICATING THE SAME

This is a continuation of application Ser. No. 09/387,052, filed Aug. 31, 1999, now U.S. Pat. No. 6,340,837.

BACKGROUND OF THE INVENTION

The present invention relates to a semiconductor device and, more particularly, to techniques which are effectively applicable to a semiconductor device employing a lead frame made of a co-per-bearing metal.

Generally, a semiconductor device formed by sealing a semiconductor chip having a circuit system and a plurality electrodes formed on a circuit forming surface, i.e., a major surface, in a sealing resin package is fabricated by an assembling process using a lead frame. More specifically, a lead frame is provided which has a frame, support leads, a die pad (tab) supported by the support leads on the frame, and a plurality of leads connected by tie bars (dam bars). An Ag paste prepared by mixing an adhesive paste, such as a thermosetting epoxy resin, and Ag powder is spread over the mounting surface of the die pad of the lead frame to form an adhesive resin film. A semiconductor chip having electrodes formed on a major surface thereof is mounted on the mounting surface of the die pad coated with the adhesive resin film with a second major surface of the semiconductor chip opposite the first major surface being in contact with the adhesive resin film formed on the die pad. The adhesive resin film is hardened to fix the semiconductor chip to the die pad. The electrodes formed on the first major surface of semiconductor chip are connected electrically to the inner leads sections of the leads of the lead frame by conductive bonding wires. The semiconductor chip, the inner leads, the die pad, the support leads and the bonding wires are sealed in a resin package. Then, the outer leads are cut off the frame of the lead frame, the tie bars are cut, the outer leads are formed in predetermined shapes, and then the support leads are cut off the frame of the lead frame.

Incidentally, it is an important problem with techniques relating to a surface-mounted semiconductor device, such as a quad flatpack package (QFP), to prevent cracks in the resin package, i.e., package cracks, due to heat applied to the surface-mounted semiconductor device for a temperature cycling test, i.e., an environmental test, or heat applied to the same during reflow soldering when mounting the semiconductor device on a wiring board. There are two known principal package cracking mechanisms that cause package cracks.

A first package cracking mechanism causes package cracks due to the separation of the die pad from the resin package and the evaporation and expansion of moisture contained in the resin package by heat applied to the semiconductor device during a temperature cycling test or reflow soldering.

A second package cracking mechanism causes package cracks due to the evaporation and expansion of moisture contained in the adhesive paste by heat applied to the semiconductor device during a temperature cycling test or reflow soldering, causing the separation of the semiconductor chip from the die pad.

A technique proposed to solve such a problem, as disclosed in, for example, Japanese Patent Laid-Open No. Sho 63-204753, uses a die pad having an area smaller than that of a semiconductor chip to be mounted thereon. According to this technique, the area of contact between a die pad and a resin package is small and hence it is possible to suppress the development of package cracks due to the evaporation and expansion of moisture absorbed by the resin package. Furthermore, since the area of the adhesive paste film sandwiched between the die pad and the semiconductor chip is small, the development of package cracks due to the evaporation and expansion of moisture absorbed by the adhesive paste film can be suppressed.

Another technique proposed to solve such a problem, as disclosed in, for example, Japanese Patent Laid-Open No. Hei 8-204107, uses an X-shaped die pad (cross tab) formed by two intersecting support leads to support a semiconductor chip at only a part of the surface thereof facing the die pad. This technique also is able to suppress the development of package cracks due to the evaporation and expansion of moisture absorbed by the resin package, and the development of package cracks due to the evaporation and expansion of moisture absorbed by the adhesive paste film.

SUMMARY OF THE INVENTION

When fabricating a semiconductor device, a Fe—Ni (iron-nickel) alloy lead frame is employed. Recently, there has been a proliferation of Cu (copper) alloy lead frames. A semiconductor device employing a Cu alloy lead frame, as compared with a semiconductor device employing an Fe—Ni alloy lead frame, exhibits an excellent heat dissipating performance and signal transmission speed. However, since the Cu alloy lead frame has a coefficient of thermal expansion greater than that of the Fe—Ni alloy lead frame, the semiconductor chip is liable to separate from the die pad of the Cu alloy lead frame, and so the reliability of the semiconductor device employing a Cu alloy lead frame in preventing package cracks is deteriorated.

It is effective, when a Cu alloy lead frame is employed, to reduce the area of the support leads in contact with a semiconductor chip by bonding the semiconductor chip to the support leads formed in the least possible width. However, a new problem arises when the width of the support leads is reduced.

The thickness of the adhesive resin film formed on the chip support parts of the support leads decreases with the decrease of the width of the support leads. Stress induced due to the difference in coefficient of thermal expansion between the support leads and the semiconductor chip is absorbed by the adhesive resin film. The stress absorbing ability of the adhesive resin film decreases with the decrease of the thickness of the adhesive resin film. In a bonding process and a molding process in which the support leads and the semiconductor chip are heated, it is difficult to absorb the stress induced by the difference in coefficient of thermal expansion between the support leads and the semiconductor chip due to the excessively thin adhesive resin film. Consequently, the support leads and the semiconductor chip are liable to separate from each other and the semiconductor chip bonded to the support leads falls off the support leads, which reduces the yield of the semiconductor device assembling process.

Accordingly, it is an object of the present invention to provide a technique which is capable of increasing the yield of a semiconductor device assembling process.

The above and other objects and, novel features of the present invention will become apparent from the following description and the accompanying drawings.

Representative examples of the invention disclosed in the present patent application will briefly described below.

(1) A semiconductor device comprises a semiconductor chip having a plurality of electrodes formed in a first major surface thereof; a resin package sealing the semiconductor chip therein; a plurality leads electrically connected to the electrodes of the semiconductor chip and formed so as to extend inside and outside the resin package; and a support lead supporting the semiconductor chip at a part of a second major surface of the semiconductor chip opposite the first major surface; wherein the semiconductor chip is bonded to the support lead with an adhesive tape.

(2) A semiconductor device comprises a square semiconductor chip having a plurality of electrodes formed in a first major surface thereof; a square resin package sealing the semiconductor chip therein; a plurality of leads electrically connected to the electrodes of the semiconductor chip and formed so as to extend inside and outside the resin package; and a support lead supporting the semiconductor chip at a part of a second major surface of the semiconductor chip opposite the first major surface, and extending through the two opposite corners of the semiconductor chip; wherein the semiconductor chip is bonded to the support lead with an adhesive tape.

(3) A semiconductor device comprises a square semiconductor chip having a plurality of electrodes formed in a first major surface thereof; a square resin package sealing the semiconductor chip therein; a plurality leads electrically connected to the electrodes of the semiconductor chip and formed so as to extend inside and outside the resin package; and a support lead supporting the semiconductor chip at a part of a second major surface of the semiconductor chip opposite the first major surface and extending across two opposite sides of the semiconductor chip; wherein the semiconductor chip is bonded to the support lead with an adhesive tape.

(4) A semiconductor device comprises a square semiconductor chip having a plurality of electrodes formed in a first major surface thereof; a square resin package sealing the semiconductor chip therein; a plurality leads electrically connected to the electrodes of the semiconductor chip and formed so as to extend inside and outside the resin package; and a support lead supporting the semiconductor chip at a part of a second major surface of the semiconductor chip opposite the first major surface; wherein the resin package has a resin transfer part in a first corner thereof, the support lead extends from the first corner of the resin package toward a second corner of the same opposite the first corner, and the semiconductor chip is bonded to the support lead with an adhesive tape.

(5) A semiconductor device comprises a square semiconductor chip having a plurality of electrodes formed in a first major surface thereof; a square resin package sealing the semiconductor chip therein; a plurality leads electrically connected to the electrodes of the semiconductor chip and formed so as to extend inside and outside the resin package; and a support lead supporting the semiconductor chip at a part of a second major surface of the semiconductor chip opposite the first major surface; wherein the resin package has a first side provided in its middle part with a resin transfer part, the support lead extends on an imaginary line connecting the middle part of the first side of the resin package and a middle part of a second side of the same opposite the first side, and the semiconductor chip is bonded to the support lead with an adhesive tape.

According to the foregoing means, the adhesive tape can be formed in a great thickness regardless of the width of the support lead. Accordingly, the thickness of the adhesive tape can be determined according to the amount of stress that may be induced due to the difference in coefficient of thermal expansion between the support lead and the semiconductor chip. Consequently, the occurrence of a problem that the semiconductor chip falls off the support lead after the die bonding process can be suppressed, whereby the yield of a semiconductor device assembling process can be improved.

DESCRIPTION OF THE PREFERRED EMBODIMENTS

Figure 1:
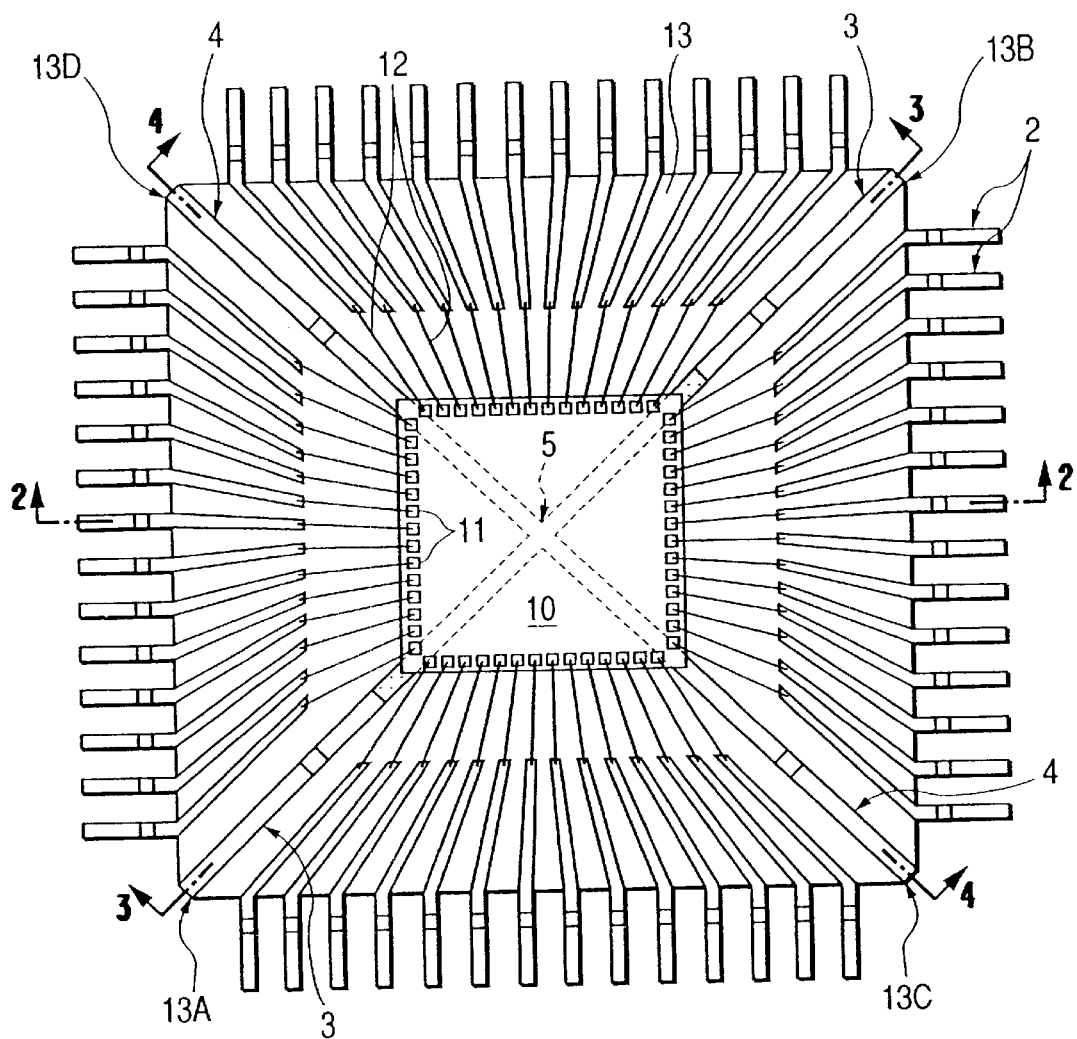
FIG. 1 is a plan view of a semiconductor device representing a first embodiment according to the present invention, in which an upper part of a resin package is removed.

Preferred embodiments of the present invention will be described with reference to the accompanying drawings, in which parts having the same functions are designated by the same reference characters and a duplicate description thereof will be omitted.

First Embodiment

A semiconductor device representing a first embodiment according to the present invention is of a QFP (quad flatpack package) type having leads arranged on the tour sides thereof.

Figure 2:
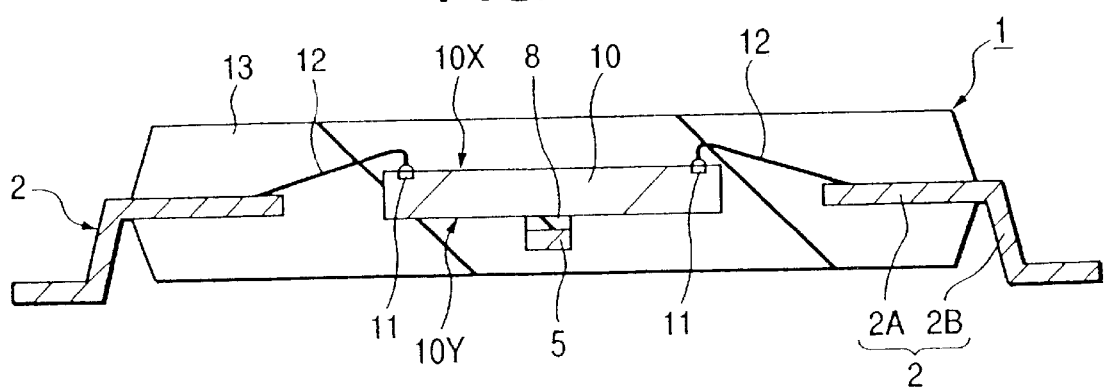
FIG. 2 is a sectional view taken on line A—A in FIG. 1.
Figure 3:
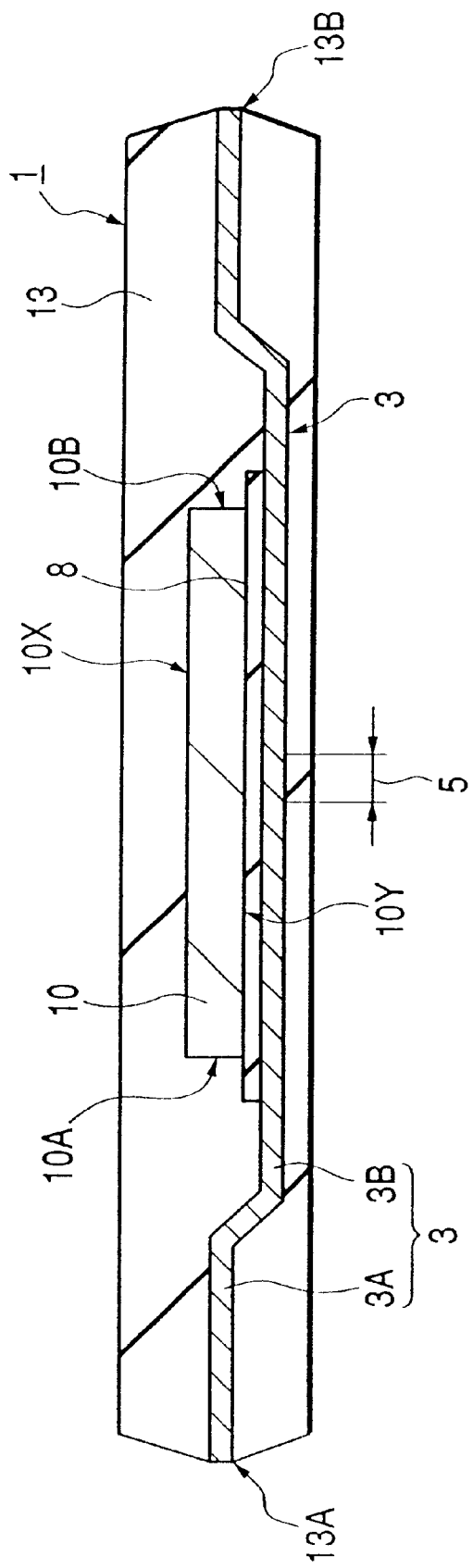
FIG. 3 is a sectional view taken on line B—B in FIG. 1.
Figure 4:
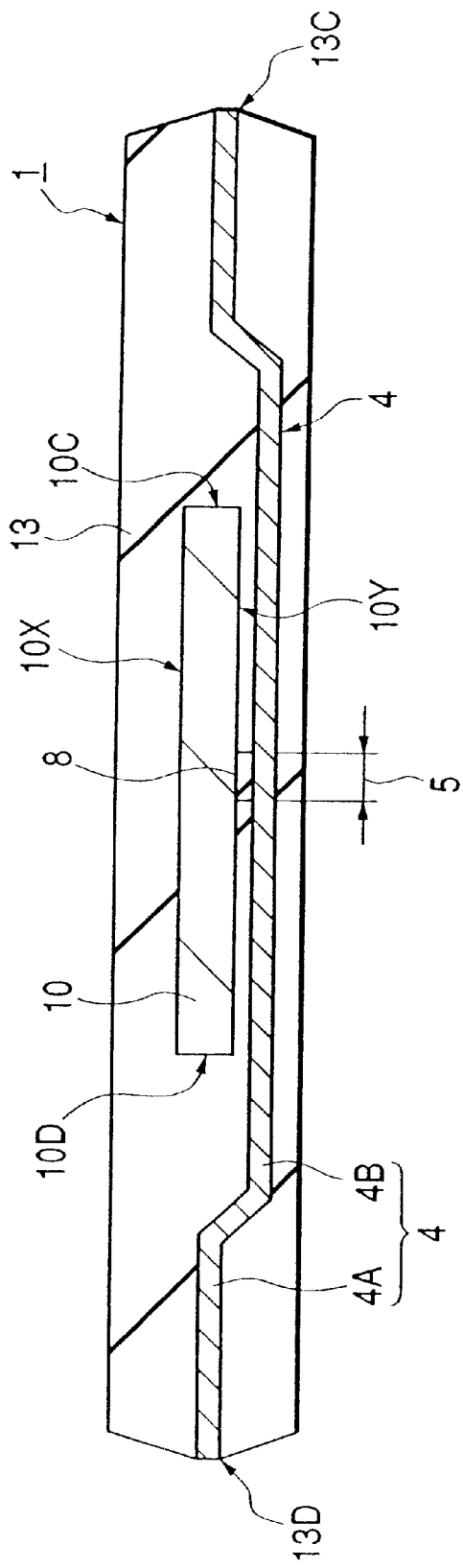
FIG. 4 is a sectional view taken on line C—C in FIG. 1.
Figure 5:
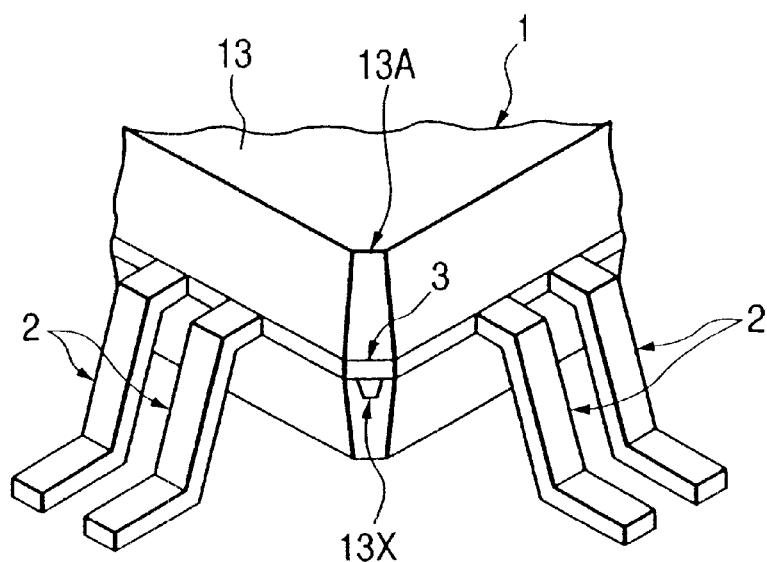
FIG. 5 is a partial perspective view of the semiconductor device.
Figure 6:
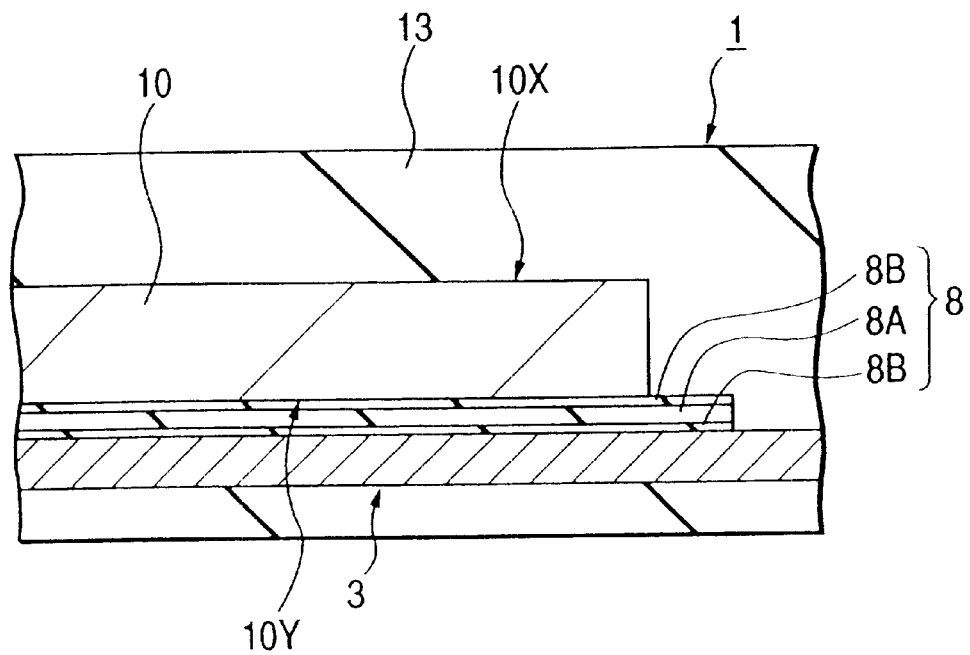
FIG. 6 is a sectional view of the part shown in FIG. 3.

The construction of the semiconductor device will be described with reference to FIGS. 1 to 6. FIG. 1 is a plan view of the semiconductor device according to the present invention, in which an upper part of a resin package is removed; FIG. 2 is a sectional view taken on line A—A in FIG. 1; FIG. 3 is a sectional view taken on line B—B in FIG. 1; FIG. 4 is a sectional view taken on line C—C in FIG. 1; FIG. 5 is a perspective view of an essential part of the semiconductor device; and FIG. 6 is a sectional view of the essential part shown in FIG. 3.

Referring to FIGS. 1, 2, 3 and 4, the semiconductor device 1 in this first embodiment is formed by mounting a semiconductor chip 10 on the intersection 5 of a support lead 3 and an auxiliary lead 4, and sealing the semiconductor chip 10 in a resin package 13.

The semiconductor chip 10 has a square shape as seen in plan view. The semiconductor chip 10 has the shape of, for example, a square whose side is 9 nun. The semiconductor chip 10 comprises, as principal components, a semiconductor substrate of single crystal silicon, and wiring layers formed on the semiconductor substrate. This semiconductor chip 10 has a coefficient of thermal expansion on the order of $3 \times 10^{-6}$ $\{1/^\circ\ C.\}$.

A circuit system, such as a logic circuit system or a composite circuit system consisting of a logic circuit system and a storage circuit system, is formed on a circuit forming surface (first major surface) 10X of the semiconductor chip 10. The circuit system comprises semiconductor elements formed on the semiconductor substrate and wiring lines formed on the semiconductor substrate and electrically connecting the semiconductor elements. A plurality of electrodes (bonding pads) 11 are formed on the circuit forming surface 10X of the semiconductor chip 10 along the sides thereof. The plurality of electrodes 11 are formed in the top one of the wiring layers of the semiconductor chip 10 and are electrically connected by the wiring lines mainly to the component semiconductor elements of the circuit system. The plurality of electrodes 11 are formed by processing a metal film, such as aluminum (Al) or an aluminum alloy.

The resin package 13 is square as seen in plan view. In this 4 embodiment, the resin package 13 has the shape of a square whose side is 14 mm. The resin package is formed of a resin, such as a biphenyl resin or an orthocresole novolac resin, containing a phenolic hardener, silicon and a filler to suppress stress induction. The resin package 13 has a coefficient of thermal expansion on the order of $13 \times 10^{-6}$ $[1/^\circ\ C.]$.

The resin package 13 is formed by a transfer molding method suitable for mass production. The transfer molding method uses a mold having a transfer pot, a runner, a transfer gate and a cavity, supplies the resin supplied from the pot to the runner, and transfers the resin through the transfer gate into the cavity to mold the resin package.

A plurality of leads 2 are arranged around the semiconductor chip 10 along the sides of the resin package 13. Each of the plurality of leads 2 extends inside and outside the resin package 13, and has an inner lead section 2A extending inside the resin package 13 and an outer lead section 2B extending outside the resin package 13.

The inner lead sections 2A of the plurality of leads 2 are connected electrically to the electrodes 11 of the semiconductor chip 10 by conductive wires 12, respectively, and the outer lead sections 2B of the same are formed in a shape suitable for surface-mounting, such as a gull-wing shape. For instance, the wires 12 are goidwires (Auwires), and the wires 12 are connected to the inner lead sections 2A by a bonding method using thermal compression bonding and ultrasonic bonding in combination.

The support lead 3, the auxiliary lead 4 and the wires 12 are sealed together with the semiconductor chip 10 in the resin package 13.

Referring to FIGS. 1 and 3, the support lead 3 extends between a first corner 13A of the resin package 13 and a second corner 13B of the same, diagonally opposite the first corner 13A, and passes a first corner 10A of the semiconductor chip 10 and a second corner 10B of the same, diagonally opposite the first corner 10A; that is, the support lead 3 extends on a diagonal connecting the first corner 13A and the second corner 13B of the resin package 13.

As shown in FIG. 3, the support lead 3 has lead sections 3A and 3B. The lead section 3A is included in the thickness direction (vertical direction) in a plane including the inner lead sections 2A of the leads 2 shown in FIG. 2. The lead section 3B is included in the thickness direction (vertical direction) in a plane below the plane including the inner lead sections 2A of the leads 2 shown in FIG. 2.

As shown in FIG. 1 and FIG. 4, the auxiliary lead 4 extends between a third corner 13C of the resin package 13 and a fourth corner 13D of the same, diagonally opposite the third corner 13C, and passes a third corner 10C of the semiconductor chip 10 and a fourth corner 10D of the same, diagonally opposite the third corner 10C, that is, the auxiliary lead 4 extends on a diagonal connecting the third corner 13C and the fourth corner 13D of the resin package 13.

As shown in FIG. 4, the auxiliary lead 4 has lead sections 4A and 4B. The lead section 4A is included in the thickness direction (vertical direction) in a plane including the lead section 3A of the lead 3 shown in FIG. 3. The lead section 4B is included in the thickness direction (vertical direction) in the plane including the lead section 3A of the support lead 3 shown in FIG. 3.

As shown in FIG. 5, a gate break mark 13X is formed at the first corner 13A of the resin package 13. The gate break mark 13X is formed when a resin gate is broken off the resin package 13. The semiconductor device 1 has a resin transfer part at the first corner 13A of the resin package 13.

As shown in FIG. 3, the semiconductor chip 10 is bonded to the lead section 3B of the support lead 3 with an adhesive tape 8. The adhesive tape 8 extends longitudinally along the support lead 3. In this embodiment, the adhesive tape 8 is stuck to the lead section 3B with parts thereof extending outside the semiconductor chip 10. The adhesive tape 8 is stuck to the lead section 3B of the support lead 3 so as to be longitudinally continuous along the support lead 3. Thus, the semiconductor chip 10 is bonded to the lead section 3B of the support lead 3 with the adhesive tape 8 longitudinally extending along the support lead 3.

The adhesive tape 8 comprises, for example, a resin base tape 8A, and adhesive layers 8B formed respectively on the major surfaces (opposite surfaces) of the base tape 8A. The resin base tape 8A is formed of a polyimide resin having a coefficient of thermal expansion on the order of, for example, $2.5 \times 10^{-5}$ $[1/^\circ\ C.]$. The adhesive layers 8B are formed of a thermoplastic poly(ether amide) or epoxy resin or a thermosetting resin having a coefficient of thermal expansion on the order of, for example, $5 \times 10^{-5}$ $[1/^\circ\ C.]$.

The thickness of the adhesive tape 8 is reduced slightly when the semiconductor chip is bonded to the support lead 3 by thermal compression bonding. The adhesive tape 8 is about 0.061 mm in thickness, the resin base tape 8A is about 0.025 mm in thickness and the adhesive layers 8B are about 0 018 nun in thickness before the semiconductor chip 10 is bonded to the support lead 3 by thermal compression bonding. The adhesive tape 8 is about 0.05 mm in thickness after the semiconductor chip 10 has been bonded to the support lead 3 by thermal compression bonding.

The thickness of the adhesive tape 8 may be increased regardless of the width of the support lead 3. Accordingly, the thickness of the adhesive tape 8 can be determined according to stress that may be induced due to the difference in coefficient of thermal expansion between the support lead 3 and the semiconductor chip 10.

The support lead 3 has a width in the range of, for example, 0.3 to 0.5 mm. Therefore the support lead 3 supports the semiconductor chip 10 at a part of a second major surface 10Y of the semiconductor chip 10 opposite the first major surface 10X of the same.

Although the support lead 3 and the auxiliary lead 4 are regarded as a single lead in the foregoing description, the embodiment may be supposed to have two support leads 3 respectively extending in opposite directions from the intersection 5, and two auxiliary leads 4 respectively extending in opposite directions from the intersection 5.

Figure 7:
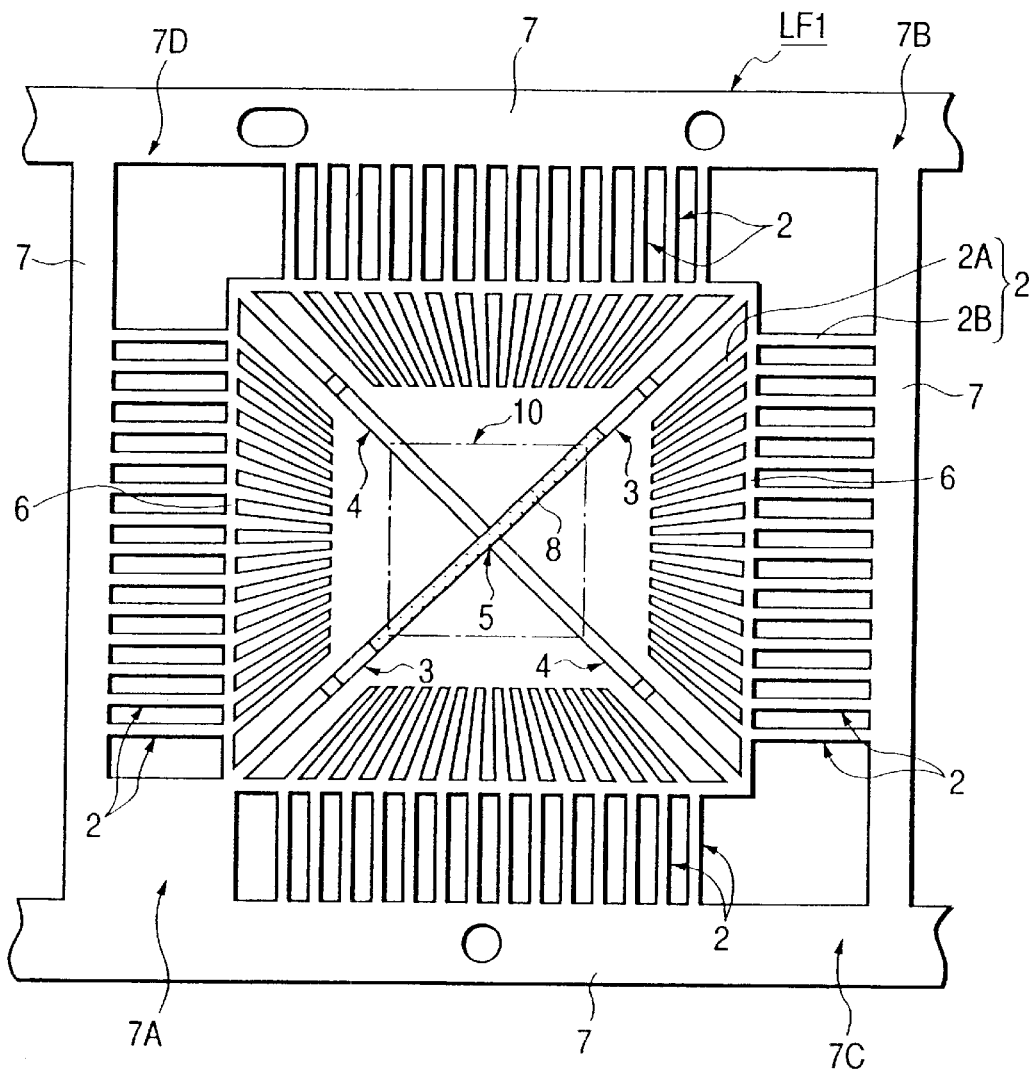
FIG. 7 is a plan view of a lead frame employed in fabricating the semiconductor device.

A lead frame employed in the semiconductor device 1 will be described with reference to FIG. 7 showing a lead frame in a plan view.

Referring to FIG. 7, a lead frame LF1 has a square frame 7, a plurality of leads 2 for electrical connection, a support lead 3 for supporting the semiconductor chip 10, and an auxiliary lead 4 for supplementing the mechanical strength of the support lead 3. A resin transfer part is formed in a first corner 7A of the frame 7 of the lead frame LF1.

The leads 2 are divided into four lead groups, and the four lead groups are arranged along the members of the frame 7, respectively. Each of the leads 2 of each lead group has an inner lead section 2A extending inside the resin package and an outer lead section 2B extending outside the resin package. The leads 2 of each lead group are connected by a tie bar 6, which prevents the leakage of the resin from the mold when molding the resin package in the mold. The outer lead sections 2B of the leads 2 of the lead groups are formed integrally with the frame 7.

The support lead 3 extends between a first corner 7A of 18 the frame 7 and a second corner 7B of the same diagonally opposite the first corner 7A. The support lead 3 has one end connected to the first corner 7a of the frame 7 and the other end connected to the tie bar 6. The support lead 3 extends on a diagonal connecting the first corner 7A and the second corner 7B of the frame 7 of the lead frame LF1.

The auxiliary lead 4 extends between a third corner 7C of the frame 7 and a fourth corner 7D of the same, diagonally opposite the third corner 7C. The auxiliary lead 4 has opposite ends connected to the tie bars 6. The auxiliary lead 4 extends on a diagonal connecting the third corner 7C and the fourth corner 7D of the frame 7 of the lead frame LF1.

The support lead 3 and the auxiliary lead 4 intersect each other and are connected to each other in a central part of a region surrounded by the frame 7. The support lead 3 and the auxiliary lead 4 are bent so that the back surface, i.e., the lower surface, of the semiconductor 10 as mounted on the support lead 3 lies in a plane below a plane including the upper connection surfaces of the leads 2.

The adhesive tape 8 is stuck to a chip mounting part of the support lead 3. The adhesive tape 8 is stuck to the lead section 3B of the support lead 3 so as to be longitudinally continuous along the support lead 3. The adhesive tape 8 has a width approximately equal to that of the support lead 3.

The lead frame LF1 is formed of, for example, a copper alloy having a coefficient of thermal expansion on the order of $17 \times 10^{-6}$ [1/° C.]. The lead frame LF1 is formed by subjecting a metal sheet to an etching process or a press working process to form the components of the lead frame LF1 including the leads 2, the support lead 3 and the auxiliary lead 4, shaping the support lead 3 and the auxiliary lead 4 by a press working process, and attaching the adhesive tape 8 to the chip mounting part of the support lead 3. incidentally, a lead frame of an Fe—Ni alloy containing, for example, 42% or 50% Ni has a coefficient of thermal expansion on the order Of $4.3 \times 10^{-6}$ [1/° C.].

Figure 8:
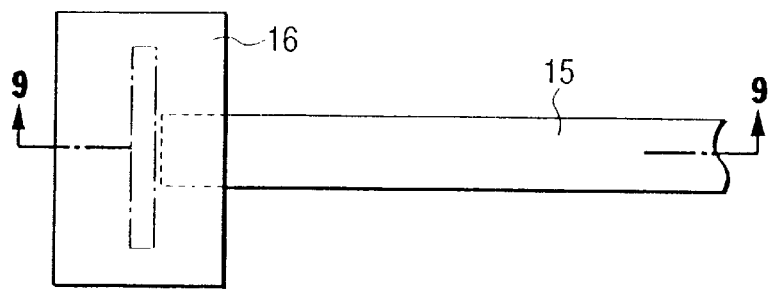
FIG. 8 is a typical plan view of a resin film in an adhesive tape forming process.
Figure 9:
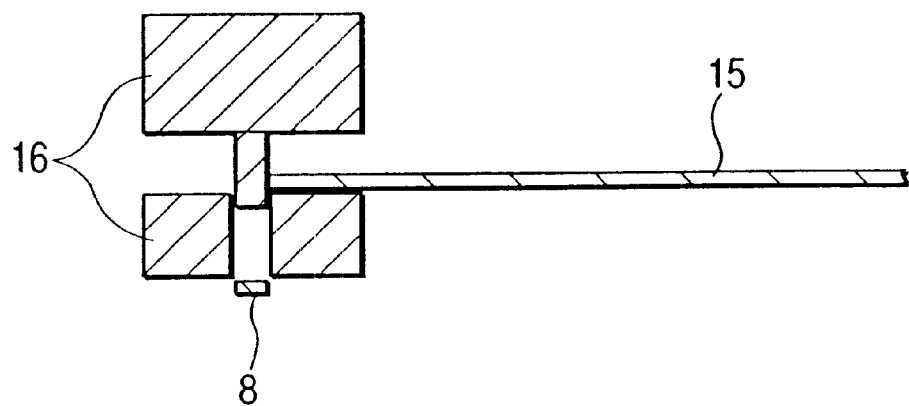
FIG. 9 is a typical sectional view taken on line D—D in FIG. 8.
Figure 10:
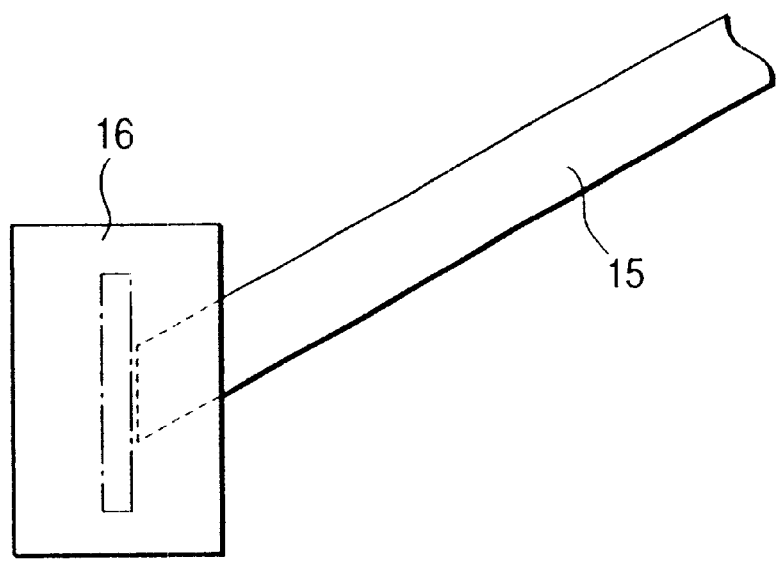
FIG. 10 is a typical plan view of a resin film in an adhesive tape forming process.

As shown in FIG. 8 (typical plan view for explaining a process of forming the adhesive tape) and FIG. 9 (a typical sectional view taken on line D—D in FIG. 8), the adhesive tape 8 is formed by cutting an adhesive ribbon 15 of a predetermined width by using a jig 16. Normally, the adhesive tape 8 is formed by cutting the adhesive ribbon 15 along a cutting line perpendicular to the long side (length) of the adhesive ribbon 15. As shown in FIG. 10 (a typical plan view for explaining a process of forming the adhesive tape) adhesive tapes 8 of different lengths can be formed by cutting the adhesive ribbon 15 along oblique cutting lines inclined at acute angles to the long side of the adhesive ribbon 15, respectively. An adhesive tape formed by cutting the adhesive ribbon 15 along an oblique cutting line inclined at an acute angle to the long side of the adhesive ribbon 15 has the shape of a parallelogram.

Figure 11:
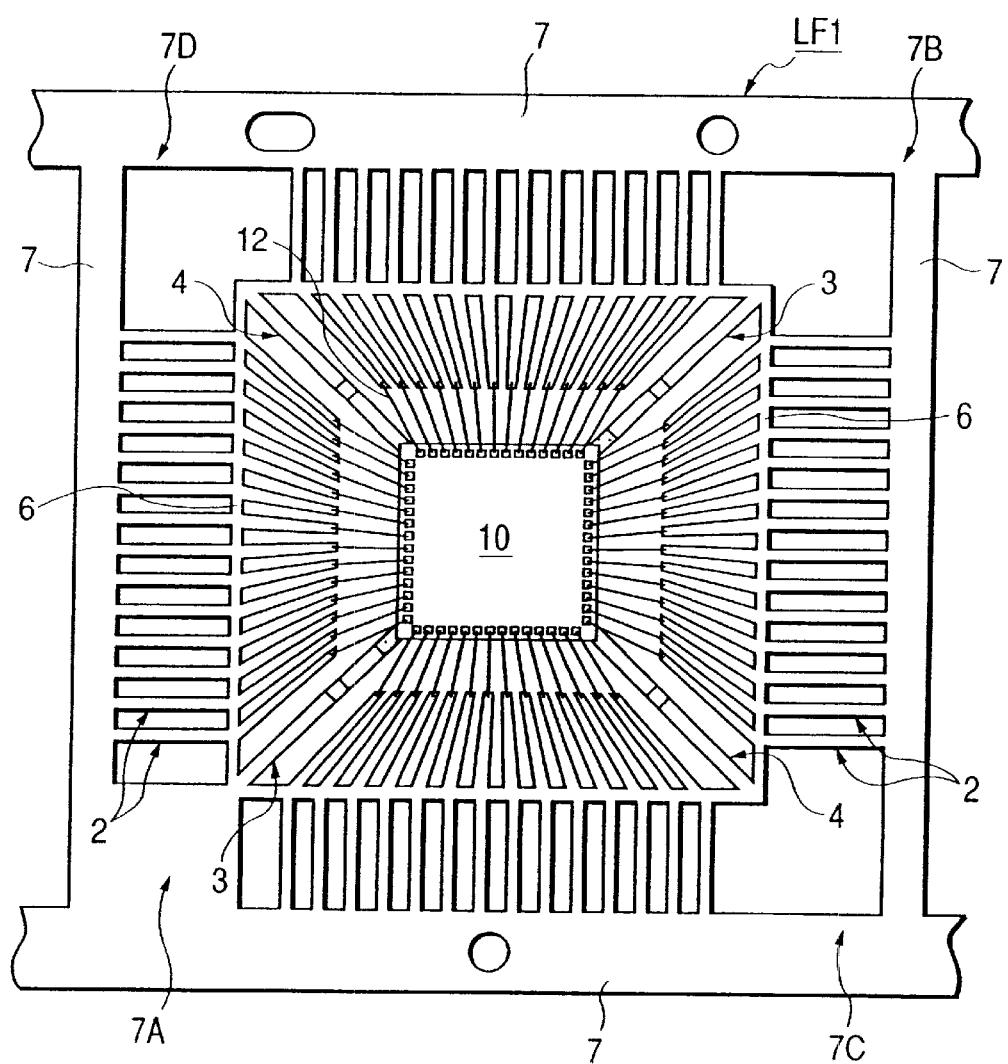
FIG. 11 is a plan view of a lead frame for use in explaining a method of fabricating the semiconductor device.

A method of fabricating the semiconductor device 1 will be described hereinafter with reference to FIGS. 11 to 13. FIG. 11 is a plan view of the semiconductor device 1 at a stage of fabrication after the completion of a wire bonding process, and FIGS. 12 and 13 are sectional views of assistance in explaining a molding process FIG. 12 is a sectional view taken on line A—A in FIG. 1, and FIG. 13 is a sectional view taken on line C—C in FIG. 1.

The lead frame LF1 shown in FIG. 7 is made as follows. A mold 20 shown in FIGS. 12 and 13 is prepared. The mold 20 has an upper mold 20A and a lower mold 2013. A cavity 21 is defined by the upper mold 20A and the lower mold 20B. The mold 20 is provided with a transfer gate 22 opening into the cavity 21, a runner 23 connected to the gate 22, and a pot, not shown, connected to the runner 23.

The semiconductor chip 10 is bonded to the chip mounting part of the support lead 3 by the adhesive tape 8 using a thermal compression bonding process Although the support lead 3 and the semiconductor chip 10 are heated in the thermal compression bonding process, the semiconductor chip 10 will not fall off the support lead 3 because the thickness of the adhesive tape 8 is determined according to stress that may be induced due to the difference between the support lead 3 and the semiconductor chip 10 in coefficient of thermal expansion. The electrodes 11 of the semiconductor chip 10 are connected electrically to the inner lead sections 2A of the leads 2 by the conductive wires 12, respectively, by a wire bonding process using thermal compression bonding and ultrasonic bonding in combination. Although the support lead 3 and the semiconductor chip 10 are heated in the wire bonding process, the semiconductor chip 10 will not fall off the support lead 3 because the thickness of the adhesive tape 8 is determined according to stress that may be induced due to the difference between the support lead 3 and the semiconductor chip 10 in coefficient of thermal expansion. These processes are illustrated in FIG. 11.

Figure 12:
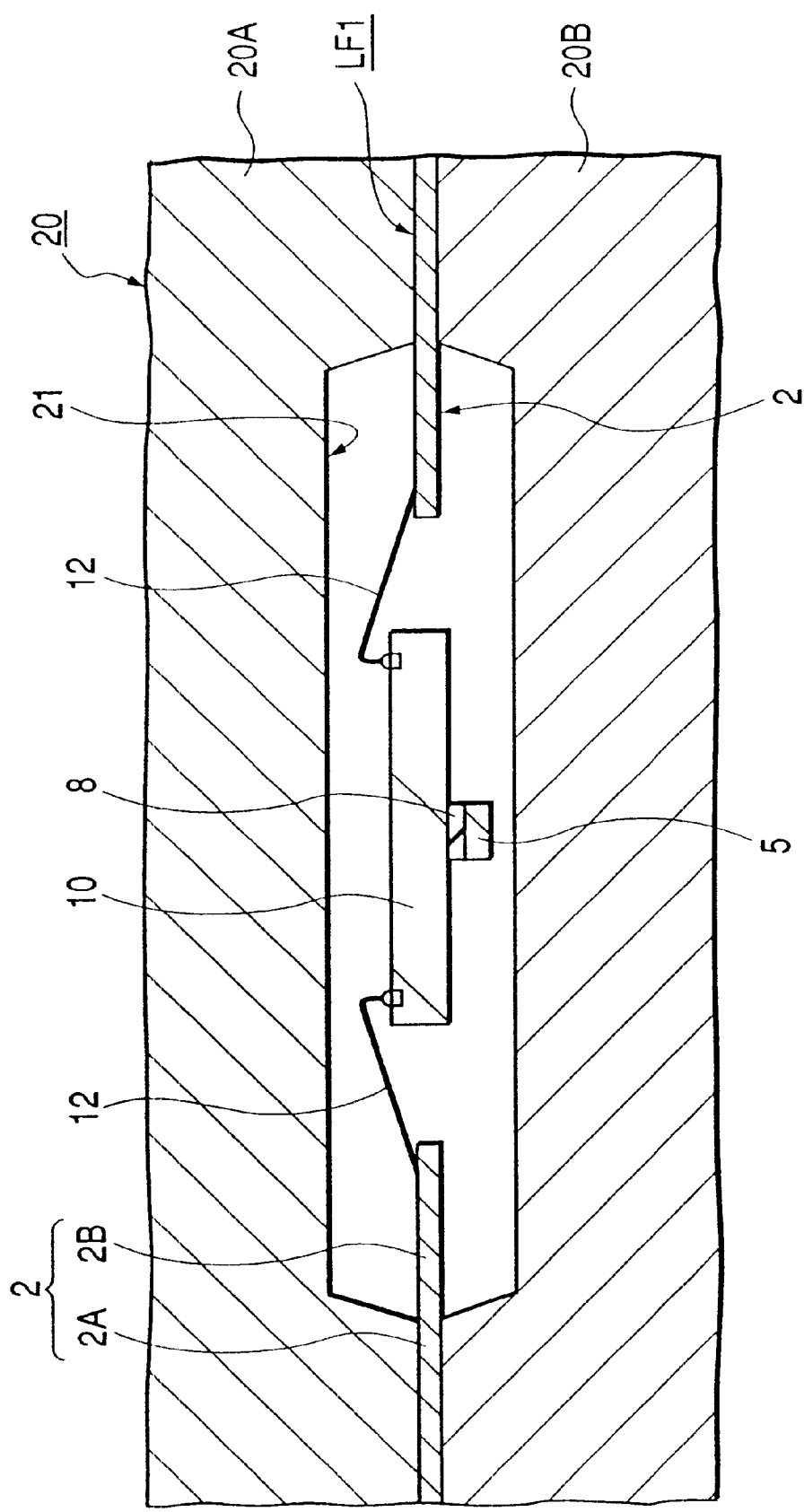
FIG. 12 is a sectional view for explaining a method of fabricating the semiconductor device.
Figure 13:
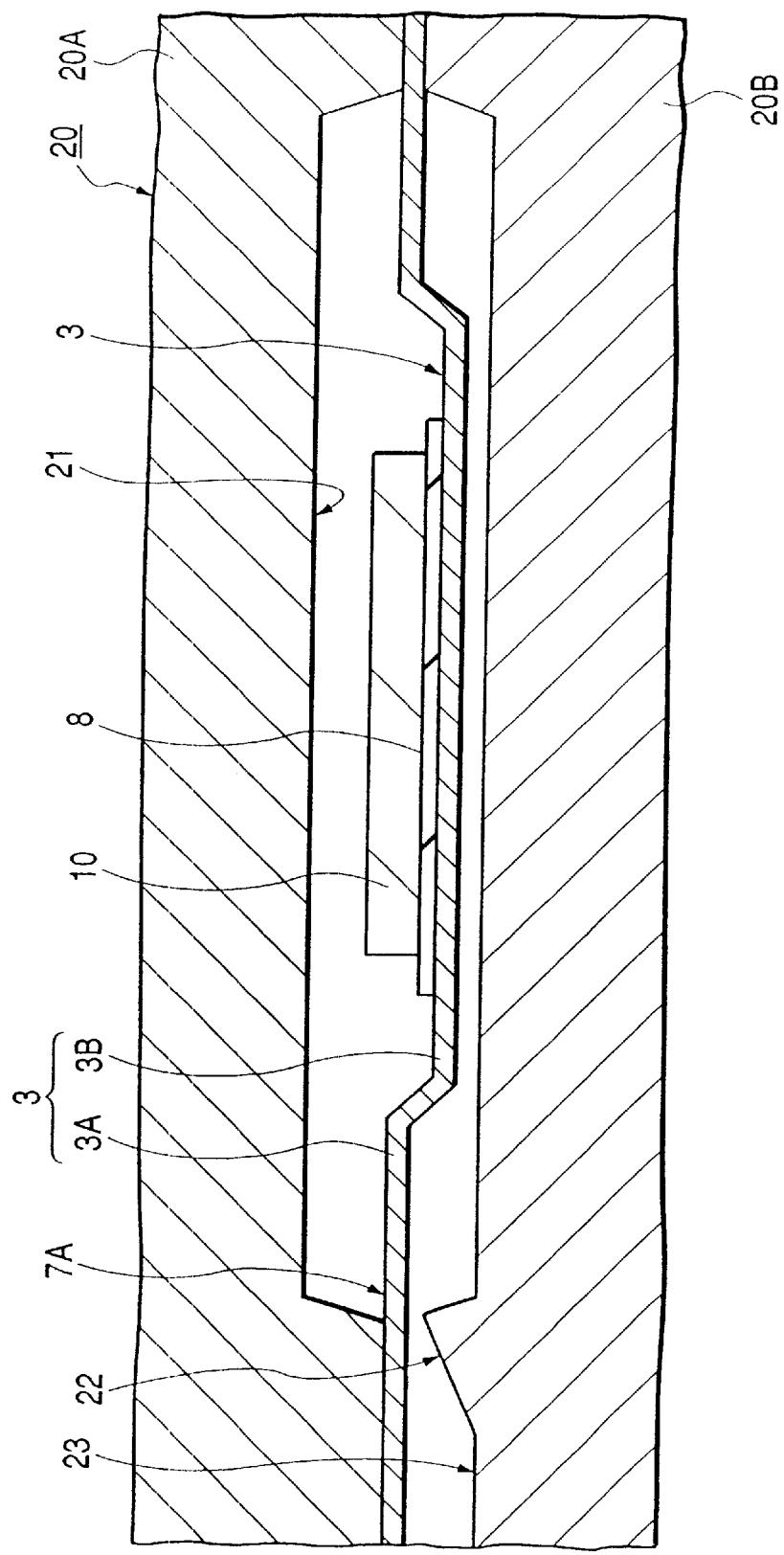
FIG. 13 is a sectional view for explaining a method of fabricating the semiconductor device.

Referring to FIGS. 12 and 13, the frame 7 is placed between the upper mold 20A and the lower mold 20B of the mold 20 with the first corner 7A (resin transfer part) thereof located at a position corresponding to the transfer gate 22, and the semiconductor chip 10, the inner lead sections of the leads 2, the support lead 3, the auxiliary lead 4 and the wires 12 disposed in the cavity 22.

In a molding process, a resin is supplied from the pot and the resin is forced under pressure to flow through the runner 23 and the transfer gate 22 into the cavity 21. Thus, the semiconductor chip 10, the inner lead sections of the leads 2, the support lead 3, the auxiliary lead 4 and the wires 12 are sealed in the resin. In the molding process, the variation of the vertical position of the semiconductor chip 10 liable to be caused by the flow of the resin forced into the cavity 21 under pressure and flowing in the cavity 21 can be suppressed because the semiconductor chip 10 is bonded to the support lead 3 extending away from the transfer gate 22. Since the auxiliary lead 4 is connected to the support lead 3, the mechanical strength of the support lead is supplemented by the auxiliary lead 4. Consequently, the variation of the vertical position of the semiconductor chip 10 liable to be caused by the resin forced under pressure. into the cavity 21 and flowing in the cavity 21 can be suppressed.

The lead frame LF1 is taken out of the mold 20, a resin gate connected to the first corner 13A of the resin package 13 is removed, the tie bars 6 connecting the leads 2 are cut, the outer lead sections 2B of the leads 2 are cut off the frame 7, the outer lead sections 2B are formed ma shape suitable for surface-mounting, such as gull-wing shape, and then the support lead 3 and the auxiliary lead 4 are cut off the frame 7 to obtain the substantially completed semiconductor device 1 shown in FIGS. 1 to 6.

The semiconductor device 1 is subjected to a temperature cycling test, and then the semiconductor device 1 is shipped as a product. The semiconductor device 1 shipped as a product is mounted on a wiring board. The temperature cycling test repeats a test cycle 1000 times. For instance, the test cycle keeps the semiconductor device 1 at −55° C. for 10 mm and then keeps the same at 150° C. for 10 mm. The semiconductor device in accordance with the present invention was subjected to the temperature cycling test. However, no cracks were formed in the resin package 13 of the semiconductor device 1.

The first embodiment exhibits the following effects.

(1) The semiconductor chip 10 is bonded to the support lead 3 by the adhesive tape 8. Accordingly, the thickness of the adhesive tape 8 can be determined regardless of the width of the support lead 3 and can be determined according to stress due to the difference in coefficient of thermal expansion between the support lead 3 and the semiconductor chip 10. Consequently, the occurrence of a problem that the semiconductor chip 10 falls off the support lead 3 after the die bonding process can be suppressed, whereby the yield of the assembling process for assembling the semiconductor device 1 can be improved.

Since the thickness of the adhesive tape 8 can be established according to the stress due to the difference in coefficient of thermal expansion between the support lead 3 and the semiconductor chip 10, the yield of the assembling process for assembling the semiconductor device 1 employing the lead frame LF1 of a Cu alloy can be improved (2) The semiconductor chip 10 is bonded to the support lead 3 extending away from the resin transfer gate. Therefore, the variation of the vertical position of the semiconductor chip 10 due to the flow of the resin forced under pressure into and flowing in the cavity 21 can be suppressed. Accordingly, the development of defects, such as the exposure of the semiconductor chip 10 and the wires 12 outside the resin package 13, can be suppressed, which improves the yield of the assembling process for assembling the semiconductor device 1.

Since the possibility of the exposure of the semiconductor chip 10 and the wires 12 outside the resin package 13 can be suppressed, the resin package 13 can be formed to have small thickness, which contributes to forming the semiconductor device 1 to have a small thickness.

(3) The support lead 3 is connected to the auxiliary lead 4. Therefore, the mechanical strength of the support lead 3 is supplemented by the auxiliary lead 4 and the variation of the vertical position of the semiconductor chip 10 due to the flow of the resin forced under pressure into the cavity 21 can be suppressed.

(4) The semiconductor chip 10 is bonded to the support lead 3 extending between the diagonally opposite first corner 10A and the second corner 1013. Therefore, as compared with a case where a central part of the semiconductor chip 10 is bonded, the vertical movement of the support lead 3 caused by the flow of the resin forced under pressure into the cavity 21 can be suppressed.

(5) The support lead 3 is extended so as to pass the two opposite corners 10A and 10B of the semiconductor chip 10, and the auxiliary lead 4 is extended so as to pass the two opposite corners 10C and 10D. Since the support lead 3 and the auxiliary lead 4 do not extend in spaces between the semiconductor chip 10 and the tips of the leads 2, the possibility of contact of the wires 12 with the support lead 3 and the auxiliary lead 4 can be avoided even if the wires 12 sag down. The longer the wires 12, the greater is the degree of sagging of the wires 12.

Even if the external dimensions of the semiconductor chip 10 are reduced and the wires 12 sag down, the wires 12 do not come into contact with the support lead 3 and the auxiliary lead 4 because the support lead 3 and the auxiliary lead 4 do not extend in the spaces between the semiconductor chip 10 and the tips of the leads 2. Therefore, semiconductor chips 10 of different dimensions can be supported on the support lead 3. Accordingly, lead frames capable of being mounted with semiconductor chips 10 of different external dimensions can be standardized.

Figure 14:
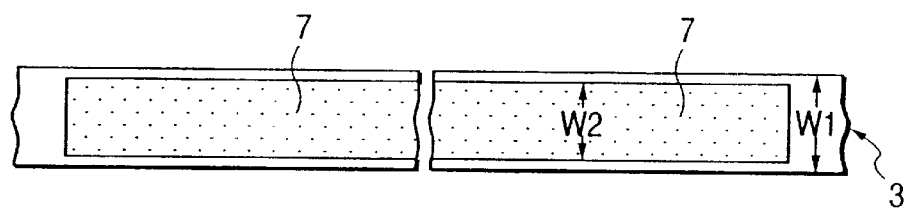
FIG. 14 is a plan view of a part of a first modified resin film.

In this embodiment, the width of the adhesive tape 8 is equal to that of the support lead 3. The width W2 of the adhesive tape 8 may be smaller than the width Wi of the support lead 3 as shown in FIG. 14.

Figure 15:
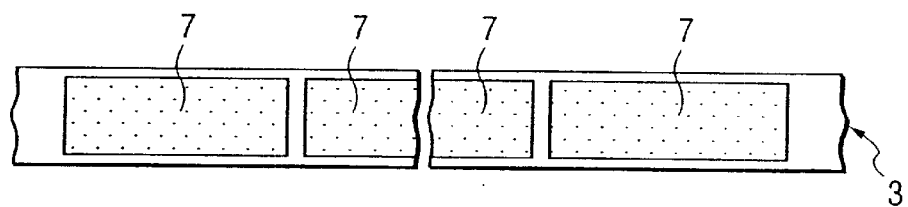
FIG. 15 is a plan view of a part of a second modified resin film.
Figure 16:
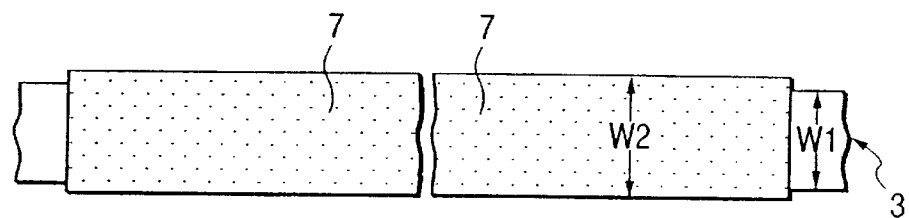
FIG. 16 is a plan view of a part of a third modified resin film.

In this embodiment, the longitudinally continuous adhesive tape 8 is attached to the support lead 3 so as to extend along the length of the support lead 3. Adhesive tapes 8 may be stuck to the support lead 3 at intervals as shown in FIG. 15. The arrangement of the adhesive tapes 8 at intervals as shown in FIG. 15 facilitates work for attaching the adhesive tape 8 to the support lead 3.

In this embodiment, the width of the adhesive tape 8 is equal to that of the support lead 3. The width W2 of the adhesive tape 8 may be greater than the width Wi of the support lead 3.

Figure 17:
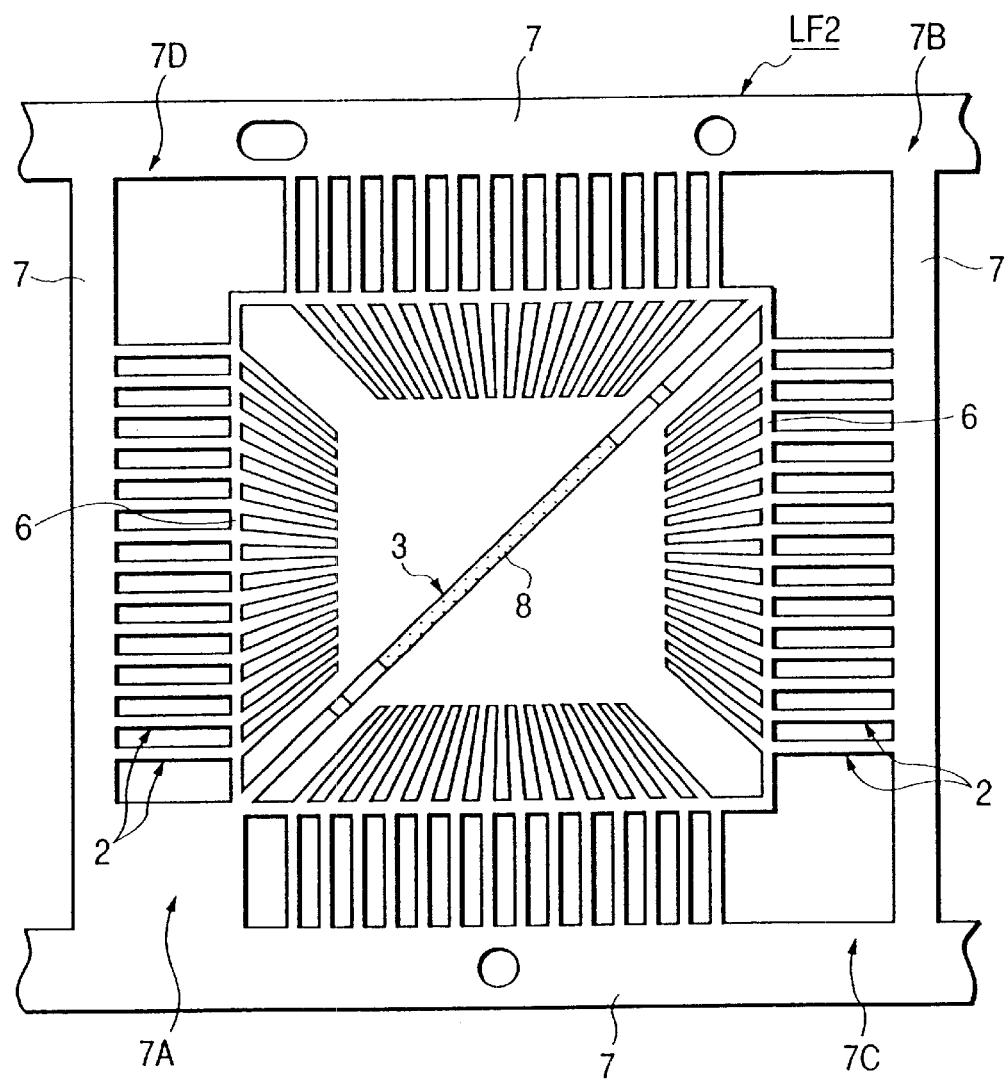
FIG. 17 is a plan view of another lead frame to be employed in fabricating the semiconductor device.

A lead frame LF2 as shown in FIG. 17 may be employed in fabricating a semiconductor device. The lead frame LF2 is not provided with any component corresponding to the auxiliary lead 4. The effects of a semiconductor device employing the lead frame LF2 are the same as those of the semiconductor device 10 in the first embodiment. When the auxiliary lead 4 is omitted, the pitches of the leads 2 can be increased, which is effective in reducing the possibility of contact between the wires that may be caused by the flow of the resin when forming the resin package.

Figure 18:
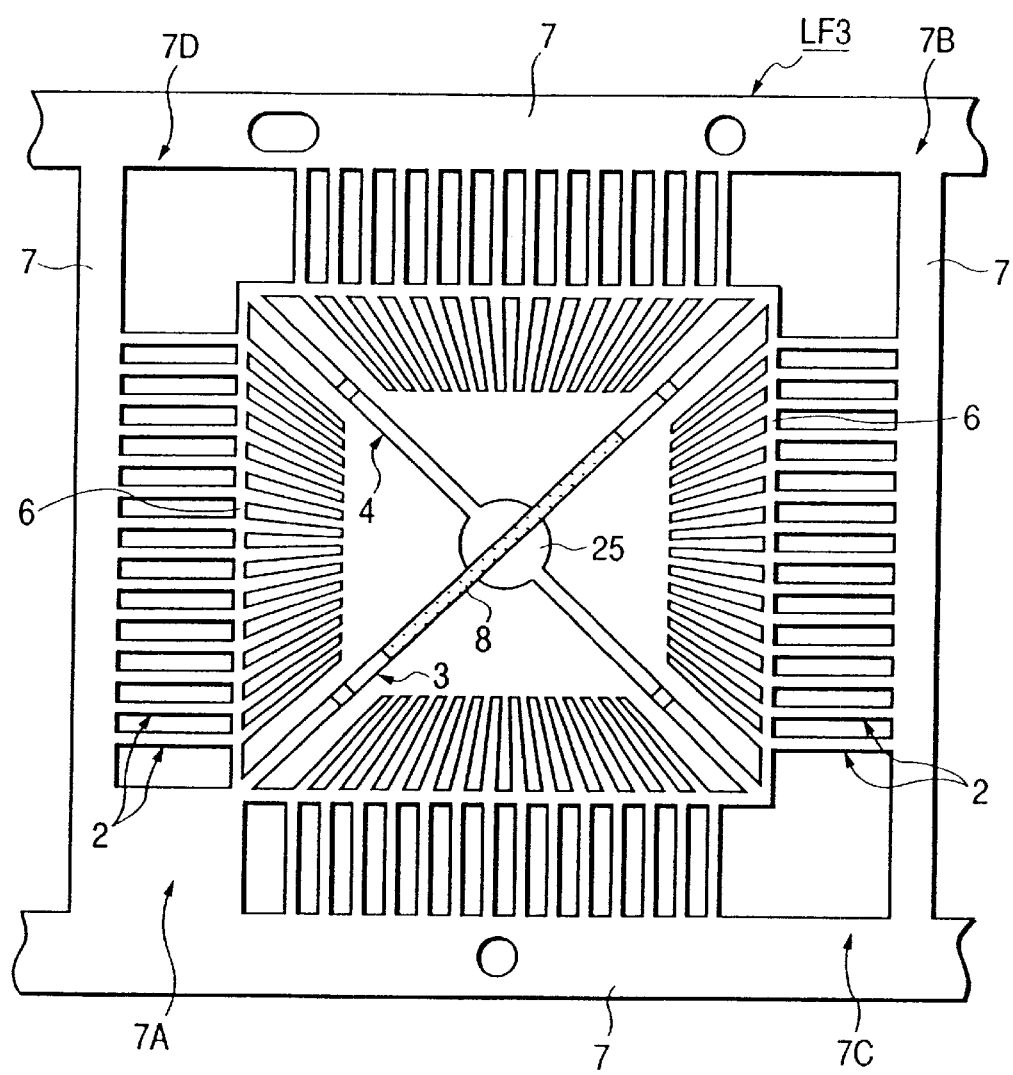
FIG. 18 is a plan view of another lead frame to be employed in fabricating the semiconductor device.

A lead frame LF3 as shown in FIG. 18 may be employed in fabricating a semiconductor device. The lead frame LF3 is provided with a pad 25 wider than a support lead 3 and an auxiliary lead 4 and formed at the intersection of the support lead 3 and the auxiliary lead 4. The effects of a semiconductor device employing the lead frame LF3 are the same as those of the semiconductor device 10 in the first embodiment. Since support frame 3 has an enhanced bending strength, the variation of the vertical position of the support lead 3 that may be caused by the flow of the resin when forming a resin package can effectively suppressed.

Figure 19:
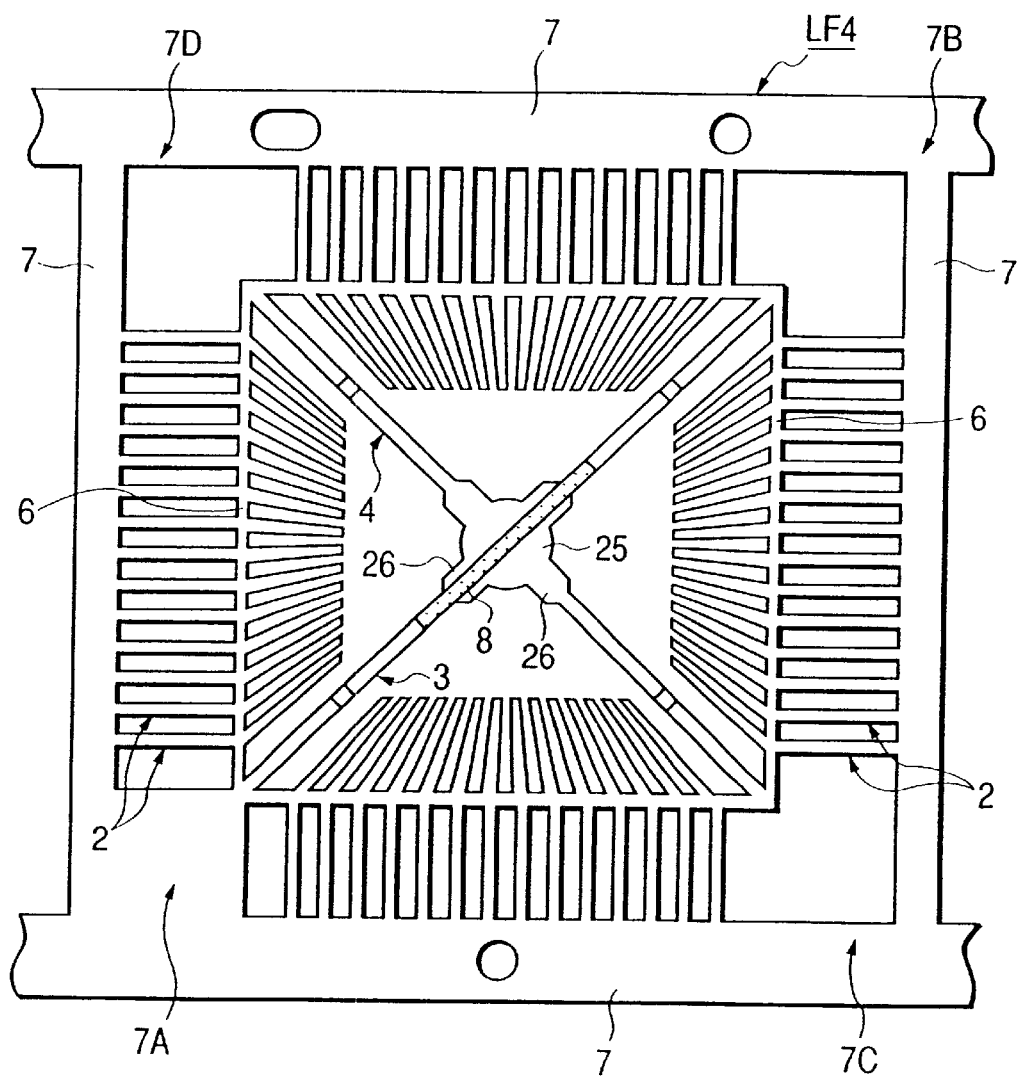
FIG. 19 is a plan view of another lead frame to be employed in fabricating the semiconductor device.

A lead frame LF4 as shown in FIG. 19 may be employed in fabricating a semiconductor device. The lead frame LF4 is provided with a pad 25 formed at the intersection of a support lead 3 and an auxiliary lead 4, and pads 26 extending from the pad 25 and formed to be wider than the support lead 3 and the auxiliary lead 4. The effects of a semiconductor device employing the lead frame LF4 are the same as those of the semiconductor device 10 in the first embodiment.

Figure 20:
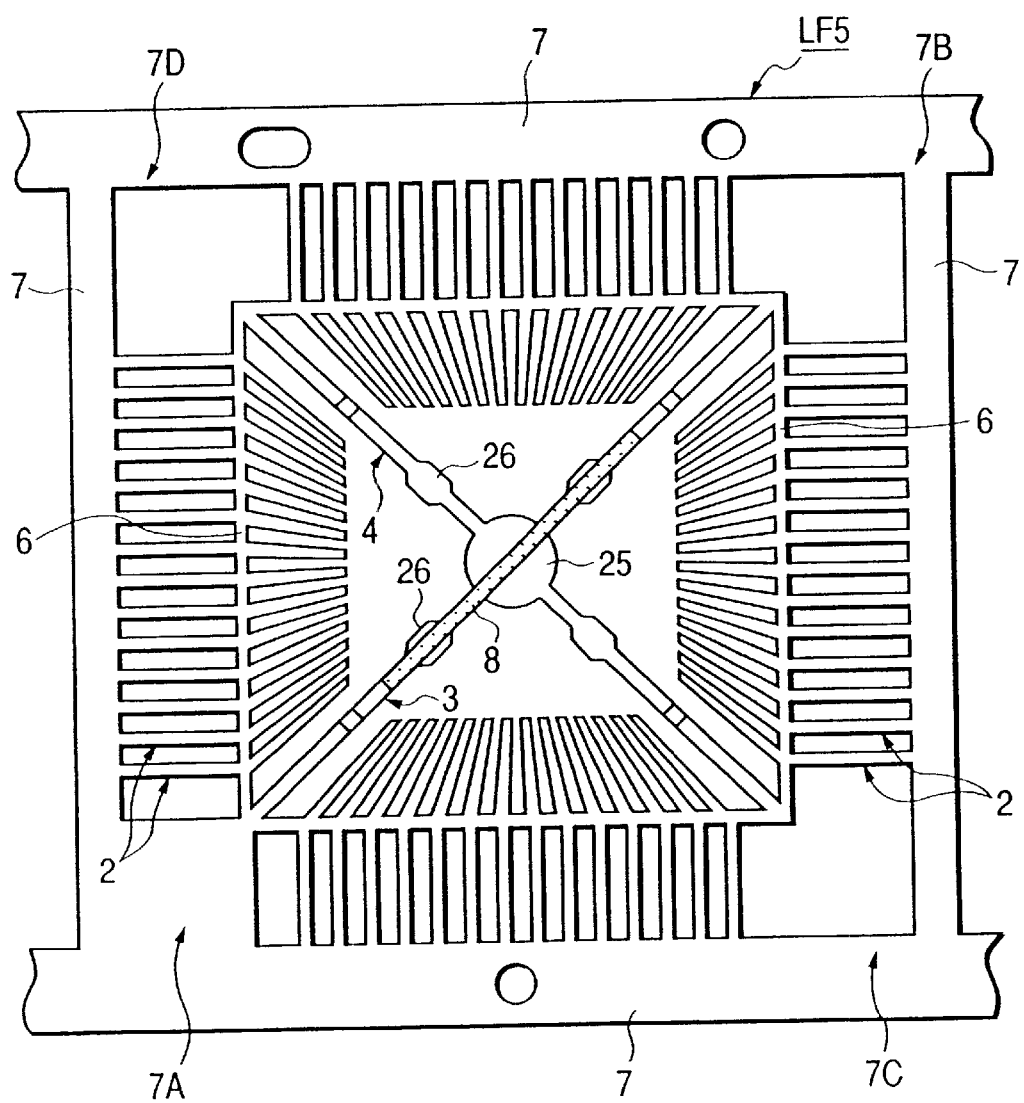
FIG. 20 is a plan view of another lead frame to be employed in fabricating the semiconductor device.

A lead frame LF5 as shown in FIG. 20 may be employed in fabricating a semiconductor device. The lead frame LF5 is provided with a pad 25 formed at the intersection of a support lead 3 and an auxiliary lead 4, and small pads 26 formed apart from the pad 25 in middle sections of the support lead 3 and the auxiliary lead 4. The effects of a semiconductor device employing the lead frame LF5 are the same as those of the semiconductor device 10 in the first embodiment.

A semiconductor device may employ a lead frame, not shown, having a support lead 3 having a support section supporting the semiconductor chip 10 thereon and having a width greater than that of sections thereof not corresponding to the semiconductor chip 10.

Although the semiconductor chip 10 is bonded to the support lead with the adhesive tape in this embodiment, the semiconductor chip 10 may be bonded to the support lead 3 with an adhesive layer, provided that the adhesive layer can be formed into a thickness not smaller than 30 μm.

Second Embodiment

A semiconductor device in a second embodiment according to the present invention is of a SOP (small outline package) type having leads arranged on the two sides thereof.

Figure 21:
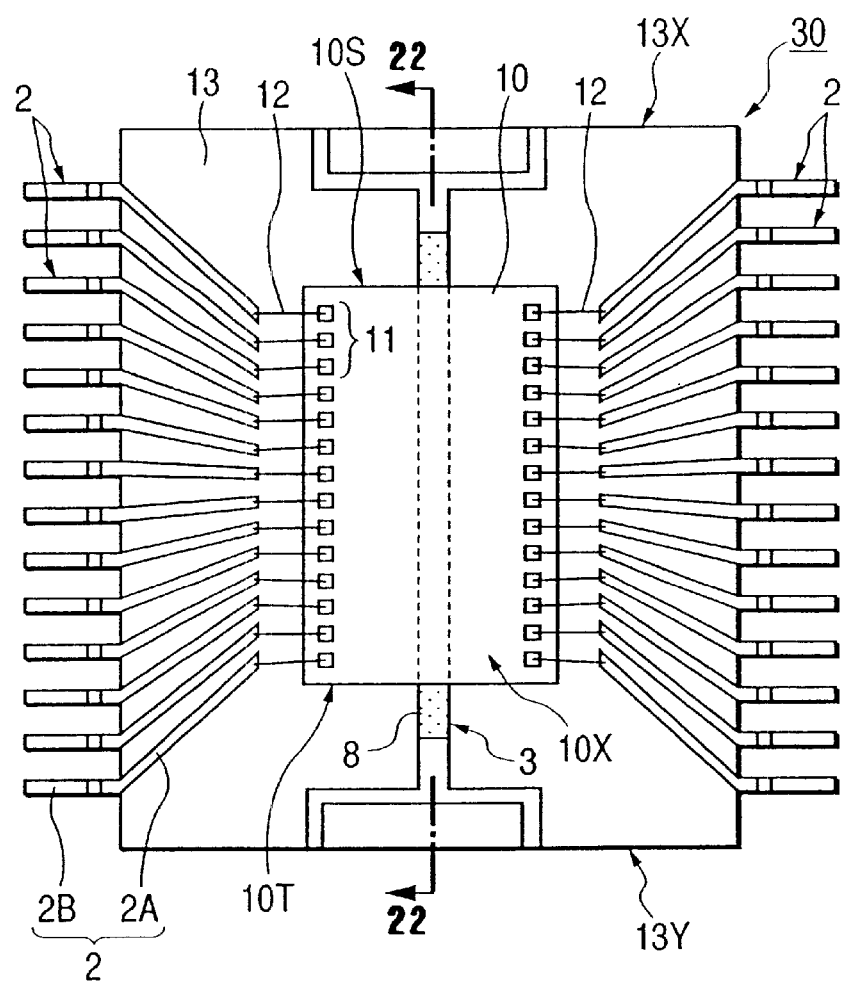
FIG. 21 is a plan view of a semiconductor device in a second embodiment according to the present invention, in which an upper part of a resin package is removed.

The construction of the semiconductor device will be described with reference to FIGS. 21 and 22. FIG. 21 is a plan view of the semiconductor device forming in a second embodiment according to the present invention, in which an upper part of a resin package is removed, and FIG. 22 is a sectional view taken on line E—E in FIG. 21.

Figure 22:
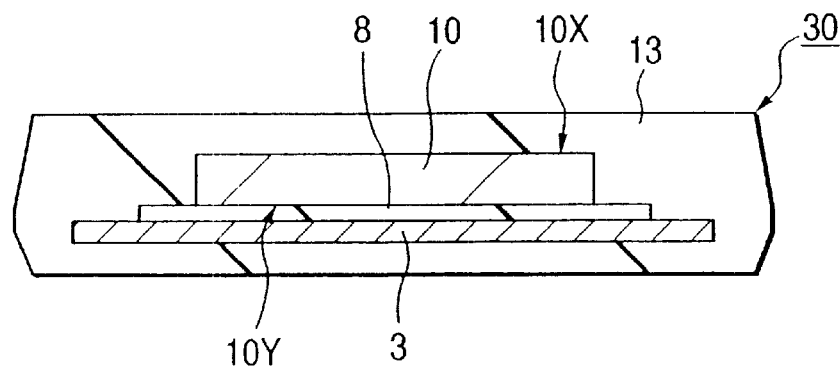
FIG. 22 is a sectional view taken on line E—E in FIG. 21.

Referring to FIGS. 21 and 22, the semiconductor device 30 in this second embodiment is formed by mounting a semiconductor chip 10 on a chip mounting part of a support lead 3, and sealing the semiconductor chip 10 in a resin package 13.

The semiconductor chip 10 has a square shape as seen in plan view and, in this embodiment, the semiconductor chip 10 has, for example, a rectangular shape. The semiconductor chip 10 has a circuit forming surface 10X. A plurality of electrodes are formed on the circuit forming surface 10X along the opposite long sides thereof. The resin package 13 has a square shape as seen in a plan view and, in this embodiment, the resin package 13 has, for example, a rectangular shape.

A plurality of leads 2 are arranged outside the semiconductor chip 10 along the opposite long sides of the resin package 13. Each of the plurality of leads 2 extends inside and outside the resin package 13, and has an inner lead section 2A extending inside the resin package 13 and an outer lead section 2B extending outside the resin package 13.

The inner lead sections 2A of the plurality of leads 2 are connected electrically to the electrodes 11 of the semiconductor chip 10 by conductive wires 12, respectively, and the outer lead sections 2B of the same are formed to have a shape suitable for surface-mounting, such as a gull-wing shape. The support lead 3, the wires 12 and the semiconductor chip 10 are sealed in the resin package 13.

The support lead 3 extends on an imaginary line extending between a middle part of a first side of the resin package 13 and a middle part of a second side 13Y of the same opposite the first side 13X. The support lead 3 extends across a first side 10S of the back surface of the semiconductor chip 10 and a second side 10T of the same opposite the first side 10S.

A gate break mark, not shown, remains on the first side 13X of the resin package 13. The gate break mark is formed when a resin gate connected to the resin package 13 is broken off. Therefore, the semiconductor device 30 in this embodiment has a resin transfer part in the middle part of the first side 13X of the resin package 13.

The semiconductor chip 10 is bonded to a lead section 313 of the support lead 3 using an adhesive tape 8. The adhesive tape 8 extends longitudinally along the support lead 3. In this embodiment, the adhesive tape 8 is stuck to the lead section 3B with parts thereof extending outside the semiconductor chip 10. The adhesive tape 8 is stuck to the lead section 3B of the support lead 3 so as to be longitudinally continuous along the support lead 3. Thus, the semiconductor chip 10 is bonded to the lead section 3B of the support lead 3 with the adhesive tape 8 longitudinally extending along the support lead 3.

The thickness of the adhesive tape 8 may be increased regardless of the width of the support lead 3. Accordingly, the thickness of the adhesive tape 8 can be determined according to stress that may be induced due to the difference in coefficient of thermal expansion between the support lead 3 and the semiconductor chip 10.

The support lead 3 has a width of, for example, about 0.4 mm. Therefore the support lead 3 supports the semiconductor chip 10 at a part of a second major surface 10Y (back surface) of the semiconductor chip 10 opposite the first major surface 10X of the same.

Figure 23:
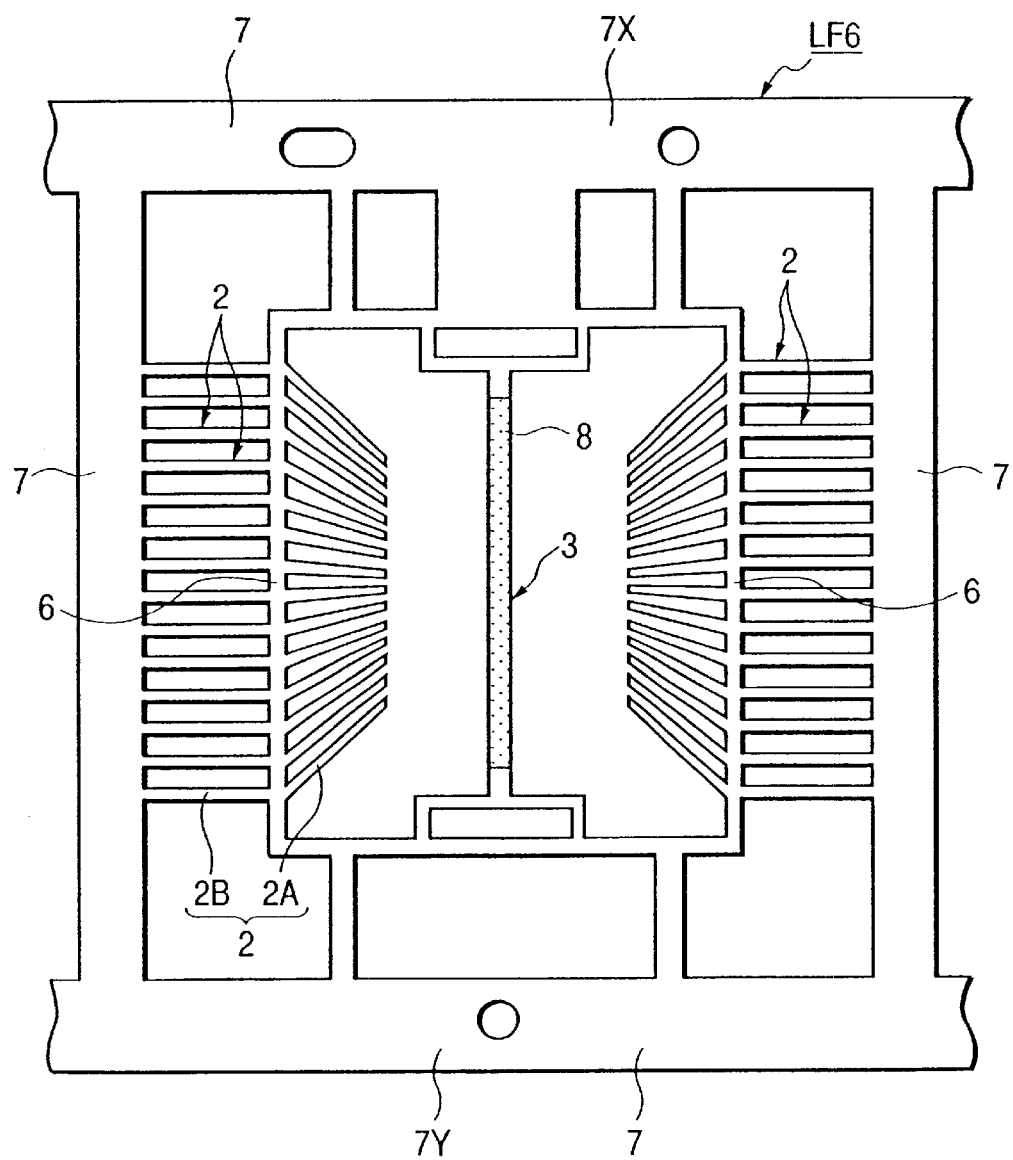
FIG. 23 is a plan view of a lead frame to be employed in fabricating the semiconductor device.

A lead frame employed in fabricating the semiconductor device 30 will be described with reference to FIG. 23 showing the lead frame in a plan view.

Referring to FIG. 23, a lead frame LF6 has a square frame 7, a plurality of leads 2 for electrical connection, and a support lead 3 for supporting the semiconductor chip 10. A resin transfer part is formed in a first frame member 7X of the frame 7 of the lead frame LF6.

The plurality of leads 2 are divided into two lead groups, and the two lead groups are disposed on the two opposite frame members of the frame 7, respectively. The leads 2 of each lead group are arranged along the frame member. Each of the leads 2 of each lead group has an inner lead section 2A extending inside the resin package and an outer lead section 2B extending outside the resin package. The leads 2 of each lead group are connected by a tie bar 6, which prevents the leakage of the resin from the mold when molding the resin package in the mold. The outer lead sections 213 of the leads 2 of the lead groups are formed integrally with the frame 7.

The support lead 3 extends between a middle part of the first frame member 7X of the frame 7 and a middle part of a second frame member 7Y opposite the first frame member 7X. The support lead 3 has one end connected to the first frame member 7X of the frame 7 and the other end connected to the tie bar 6. The support lead 3 extends on a diagonal connecting the first frame member 7X and the second frame member 7Y of the frame 7 of the lead frame LF6.

The adhesive tape 8 is stuck to the chip mounting part of the support lead 3. The adhesive tape 8 is stuck to the lead section 3B of the support lead 3 so as to be longitudinally continuous along the support lead 3. The adhesive tape 8 has a width approximately equal to that of the support lead 3.

A method of fabricating the semiconductor device 30 will be described hereinafter. The lead frame LF6 shown in FIG. 23 is made. A mold is prepared. The mold has an upper mold and a lower mold. A cavity is defined by the upper and the lower mold. The mold is provided with a transfer gate opening into the cavity, a runner connected to the transfer gate, and a pot connected to the runner.

The semiconductor chip 10 is bonded to the chip mounting part of the support lead 3 by the adhesive tape 8 using a thermal compression bonding process Although the support lead 3 and the semiconductor chip 10 are heated in the thermal compression bonding process, the semiconductor chip 10 will not fall off the support lead 3 because the thickness of the adhesive tape 8 is determined according to stress that may be induced due to the difference between the support lead 3 and the semiconductor chip 10 in coefficient of thermal expansion. The electrodes 11 of the semiconductor chip 10 are connected electrically to the inner lead sections 2A of the leads 2 by the conductive wires 12, respectively, by a wire bonding process using thermal compression bonding and ultrasonic bonding in combination. Although the support lead 3 and the semiconductor chip 10 are heated in the wire bonding process, the semiconductor chip 10 will not fall off the support lead 3 because the thickness of the adhesive tape 8 is determined according to stress that may be induced due to the difference between the support lead 3 and the semiconductor chip 10 in coefficient of thermal expansion.

The frame 7 is placed between the upper and the lower mold of the mold with the resin transfer part thereof located at a position corresponding to the transfer gate, and the semiconductor chip 10, the inner lead sections of the leads 2, the support lead 3 and the wires 12 disposed in the cavity.

In a molding process, a resin is supplied from the pot and the resin is forced under pressure to flow through the runner and the transfer gate into the cavity. Thus, the semiconductor chip 10, the inner lead sections of the leads 2, the support lead 3 and the wires 12 are sealed in the resin. In the molding process, the variation of the vertical position of the semiconductor chip 10 liable to be caused by the flow of the resin forced into the cavity under pressure and flowing in the cavity can be suppressed because the semiconductor chip 10 is bonded to the support lead 3 extending away from the transfer gate.

The lead frame LF6 is taken out of the mold, a resin gate connected to the first side 13X of the resin package 13 is removed, the tie bars 6 connecting the leads 2 are cut, the outer lead sections 2B of the leads 2 are cut off the frame 7, the outer lead sections 2B are formed in a shape suitable for surface-mounting, such as a gull-wing shape, and then the support lead 3 is cut off the frame 7 to obtain the substantially completed semiconductor device 30 shown in FIGS. 21 and 22. The second embodiment has effects similar to those of the first embodiment.

Although the invention has been described with reference to preferred embodiments thereof, the embodiments described herein are not restrictive and many changes and variations may be made therein without de parting from the scope of the present invention.

For example, the present invention is applicable to semiconductor devices of a SIP (single in-line package) type and a ZIP (zigzag in-line package) type having leads arranged in a single row.

The present invention is applicable also to semiconductor devices of a SOJ (small out-line J-leaded package) type and a TSOP (thin small out-line package) type having leads arranged in two rows.

The present invention is applicable also to semiconductor devices of a QFJ (quad flat pack J-leaded package) type having leads arranged in four rows.

What is claimed is:

1. A quad flat type semiconductor package comprising:

a semiconductor chip having a major surface and a rear surface opposite to said major surface, said semiconductor chip having a plurality of semiconductor elements and bonding pads formed on said major surface;

a first supporting lead and a second supporting lead for mounting said semiconductor chip, said first supporting lead extending in a first direction, said second supporting lead intersecting said first supporting lead at an intersection and extending in a second direction which is different from said first direction, said first and second supporting leads being integrally formed with each other;

a plurality of leads each having an inner lead and an outer lead which is continuously formed with said inner lead, said plurality of leads being arranged to surround said intersection of said first and second supporting leads;

a plurality of bonding wires electrically connecting said inner leads of said plurality of leads with said plurality of bonding pads, respectively; and a resin sealing body having a tetragonal shape sealing said semiconductor chip, said inner leads of said plurality of leads, said first and second supporting leads and said plurality of bonding wires, wherein said outer leads of said plurality of leads protrude outwardly from four sides of said resin sealing body and are bent toward a lower surface side of said resin sealing body to provide an electrical connection with a printed circuit board;

wherein said semiconductor chip is mounted on said intersection of said first and second supporting leads, wherein an area where said first and second supporting leads overlap with said semiconductor chip is smaller than an area of, said semiconductor chip, wherein said semiconductor chip is adhered to said first and second supporting leads by an adhesive layer formed between said rear surface of said semiconductor chip and said intersecting portion of said first and second supporting leads, and wherein said adhesive layer includes a base insulating film having upper and lower sides and adhesive formed on both the upper and lower sides of said base insulating film.

2. A semiconductor device according to claim 1, wherein one portion of said rear surface of said semiconductor chip is adhered to said first and second supporting leads, and wherein another portion of said rear surface of said semiconductor chip is directly contacted with said resin sealing body.

\* \* \* \* \*